(12) United States Patent
Kim

(10) Patent No.: US 10,443,621 B2
(45) Date of Patent: Oct. 15, 2019

(54) BLOWING SYSTEM

(71) Applicant: TNE KOREA CO., LTD., Daejeon (KR)

(72) Inventor: Kyeong Su Kim, Daejeon (KR)

(73) Assignee: TNE KOREA CO., LTD., Daejeon (KR)

( * ) Notice: Subject to any disclaimer, the term of this patent is extended or adjusted under 35 U.S.C. 154(b) by 213 days.

(21) Appl. No.: 15/546,058

(22) PCT Filed: Mar. 11, 2016

(86) PCT No.: PCT/KR2016/002424
§ 371 (c)(1),
(2) Date: Jul. 25, 2017

(87) PCT Pub. No.: WO2016/148442
PCT Pub. Date: Sep. 22, 2016

(65) Prior Publication Data
US 2018/0023592 A1   Jan. 25, 2018

(30) Foreign Application Priority Data
Mar. 13, 2015 (KR) .................. 10-2015-0035150

(51) Int. Cl.
*F04D 29/58* (2006.01)
*F04D 25/08* (2006.01)
*H05K 7/20* (2006.01)
*F04D 25/06* (2006.01)

(52) U.S. Cl.
CPC ....... *F04D 29/5813* (2013.01); *F04D 25/082* (2013.01); *H05K 7/20918* (2013.01); *F04D 25/06* (2013.01)

(58) Field of Classification Search
CPC . F04D 29/5813; F04D 25/082; H05K 7/2089; H05K 7/209; H05K 7/20909; H05K 7/20918
See application file for complete search history.

(56) References Cited

U.S. PATENT DOCUMENTS

2015/0022972 A1 * 1/2015 Kwon .................. F24F 7/007
361/690

FOREIGN PATENT DOCUMENTS

| JP | S55-163493 U | 5/1980 |
| JP | H03-178619 A | 8/1991 |
| JP | H05-92495 U | 12/1993 |

(Continued)

*Primary Examiner* — Richard A Edgar
(74) *Attorney, Agent, or Firm* — KORUS Patent, LLC; Seong Il Jeong

(57) ABSTRACT

A blowing system includes: a blower; a case including: a blower receiving portion for receiving a heat source of the blower; a gas inlet for suctioning the gas from the outside; a gas passage connected from the gas inlet to a blower inlet; and an inverter receiving portion in which an inverter are installed; and a cooling member for cooling the inverter by using air, and has one end coupled to the inverter and the other end exposed to the gas passage, wherein the blower receiving portion is spatially separated from the gas passage, and the gas flows through the gas passage due to a suctioning force of an impeller, and the cooling member is cooled by the gas. According to the present invention, without separate cooling fans, the inverter may be quickly cooled only with the flow of gas generated by the impeller.

10 Claims, 10 Drawing Sheets

(56) References Cited

FOREIGN PATENT DOCUMENTS

| | | |
|---|---|---|
| JP | H08-284831 A | 10/1996 |
| JP | H10-184597 A | 7/1998 |
| JP | 2001-245478 A | 9/2001 |
| JP | 2013-128051 A | 6/2013 |
| KR | 10-0572850 B1 | 4/2006 |
| KR | 10-0675821 B1 | 1/2007 |
| KR | 10-0898911 B1 | 5/2009 |
| KR | 10-2013-0140454 A | 12/2013 |

* cited by examiner

BLOWING SYSTEM

TECHNICAL FIELD

Embodiments of the present inventive concept relate to a blowing system, and more particularly, to a blowing system capable of quickly cooling an inverter using only a flow of gas generated by a suctioning force of an impeller, without including a separate cooling fan for cooling the inverter.

BACKGROUND ART

A turbo blower or a turbo compressor is a centrifugal pump configured to rotate an impeller at a high speed to intake external air or external gas, in order to send the air or gas to the outside after compressing the air or gas, and is widely used for powder transportation or aeration in a sewage disposal plant.

A conventional turbo blower includes a product configured to rotate the impeller by using a rotational force of an electric motor. For such a turbo blower, an inverter configured to generate a high speed current waveform for controlling a speed of a motor and supply the high speed current waveform to the motor is essentially needed.

However, most inverters include a heat radiating element, such as an insulated gate bipolar transistor (IGBT), and the IGBT, which is an electrical device for generating a high speed current waveform, generates a large amount of heat due to electrical switching, and thus, for a continual operation of the motor, a continual cooling operation of the IGBT is needed. Moreover, the amount of heat generated by the IGBT increases in proportion to a switching frequency.

The conventional turbo blower uses a method (a compulsory air-cooled method) of cooling the inverter by using air by rotating a cooling fan or a method (a water-cooled method) of cooling the inverter by using a refrigerant, such as cooling water, in order to cool the inverter.

In the case of the compulsory air-cooled method, a small cooling fan, in which a direct current (DC) motor having relatively less power consumption is mounted, is used in general. However, this small cooling fan has a relatively low capability of supplying cooling air and has a very short life span.

In the case of the water-cooled method, a cooling efficiency is relatively high, but a complex structure such as a water tank or a radiator has to be used, and the danger of leakage of the cooling water is high.

In addition, the conventional turbo blower has a structure whereby the heat generated from the inverter and the heat generated from the motor may be mixed, and thus, a gas heated by the motor may flow into the impeller.

DETAILED DESCRIPTION OF THE INVENTION

Technical Problem

In order to solve the problems described above, embodiments of the present inventive concept aim to provide a blowing system having an improved structure to quickly cool an inverter using only a flow of gas generated by a suctioning force of an impeller, without including a separate cooling fan for cooling the inverter.

Technical Solution

According to an aspect of the present inventive concept, there is provided a blowing system for compressing and supplying a gas, such as air, to the outside, the blowing system including: a blower including: a blower inlet for suctioning the gas; an impeller for compressing the gas suctioned through the blower inlet; and a blower outlet for discharging the gas compressed by the impeller to the outside; a case including: a blower receiving portion for receiving a heat source of the blower; a gas inlet for suctioning the gas from the outside; a gas passage connected from the gas inlet to the blower inlet; and an inverter receiving portion in which electronic components including an inverter are installed; and a cooling member that is a member for cooling the inverter by using air, and has one end coupled to the inverter and the other end exposed to the gas passage, wherein the blower receiving portion is spatially separated from the gas passage so that the gas heated by the heat source of the blower does not flow into the gas passage from the blower receiving portion, and the gas flows through the gas passage by means of a suctioning force generated by the impeller, and the cooling member is cooled by the gas.

The cooling member may include: a base portion coupled to the inverter; and a plurality of cooling pins protruding from the base portion and arranged apart from each other by a predetermined distance.

The gas passage may include: a first space portion connected to the gas inlet; a second space portion connected to the other end of the cooling member; and a third space portion connected to the blower inlet.

The blower receiving portion may be arranged between the first space portion and the third space portion, the inverter receiving portion may be arranged below the blower receiving portion, the second space portion may be arranged below the inverter receiving portion, and the gas passage may be bent in a form of a "U."

The blowing system of claim may further include: a cooling air inlet formed at a surface of the blower receiving portion; a cooling air outlet formed at the other surface of the blower receiving portion; and a cooling fan mounted in at least one of the cooling air inlet and the cooling air outlet and suctioning the air from the outside into the blower receiving portion.

The second space portion may include: a base passage through which the gas flows regardless of pressure loss between an upstream and a downstream of the cooling member; and an additional passage through which the gas flows only when the pressure loss between the upstream and the downstream of the cooling member is equal to or greater than a predetermined value.

A flow adjusting unit may be mounted in the additional passage to automatically open the additional passage when the pressure loss between the upstream and the downstream of the cooling member is equal to or greater than the predetermined value and to automatically close the additional passage when the pressure loss between the upstream and the downstream of the cooling member is less than the predetermined value.

The flow adjusting unit may include: a flow adjusting plate capable of a rotational motion between an opening position at which the flow adjusting unit opens the additional passage and a closing position at which the flow adjusting unit closes the additional passage; and a biasing device for biasing the flow adjusting plate to the closing position elastically or gravitationally.

When the other end of the cooling member contacts the case, heat may be conducted from the cooling member to the case to be discharged to the outside.

The gas passage may be arranged at an outer portion of an inner space of the case so that heat of the gas flowing through the gas passage is conducted to the case to be discharged to the outside.

Advantageous Effect

A blowing system for compressing and supplying a gas, such as air, to the outside, includes: a blower including: a blower inlet for suctioning the gas; an impeller for compressing the gas suctioned through the blower inlet; and a blower outlet for discharging the gas compressed by the impeller to the outside; a case including: a blower receiving portion for receiving a heat source of the blower; a gas inlet for suctioning the gas from the outside; a gas passage connected from the gas inlet to the blower inlet; and an inverter receiving portion in which electronic components including an inverter are installed; and a cooling member that is a member for cooling the inverter by using air, and has one end coupled to the inverter and the other end exposed to the gas passage, wherein the blower receiving portion is spatially separated from the gas passage so that the gas heated by the heat source of the blower does not flow into the gas passage from the blower receiving portion, and the gas flows through the gas passage by means of a suctioning force generated by the impeller, and the cooling member is cooled by the gas.

According to the present inventive concept, without including a separate cooling fan for cooling the inverter, the inverter may be quickly cooled by using only the flow of gas generated by the suctioning force of the impeller.

BEST MODE

Hereinafter, preferred embodiments of the present inventive concept will be described in detail by referring to the accompanying drawings.

Figure 1:
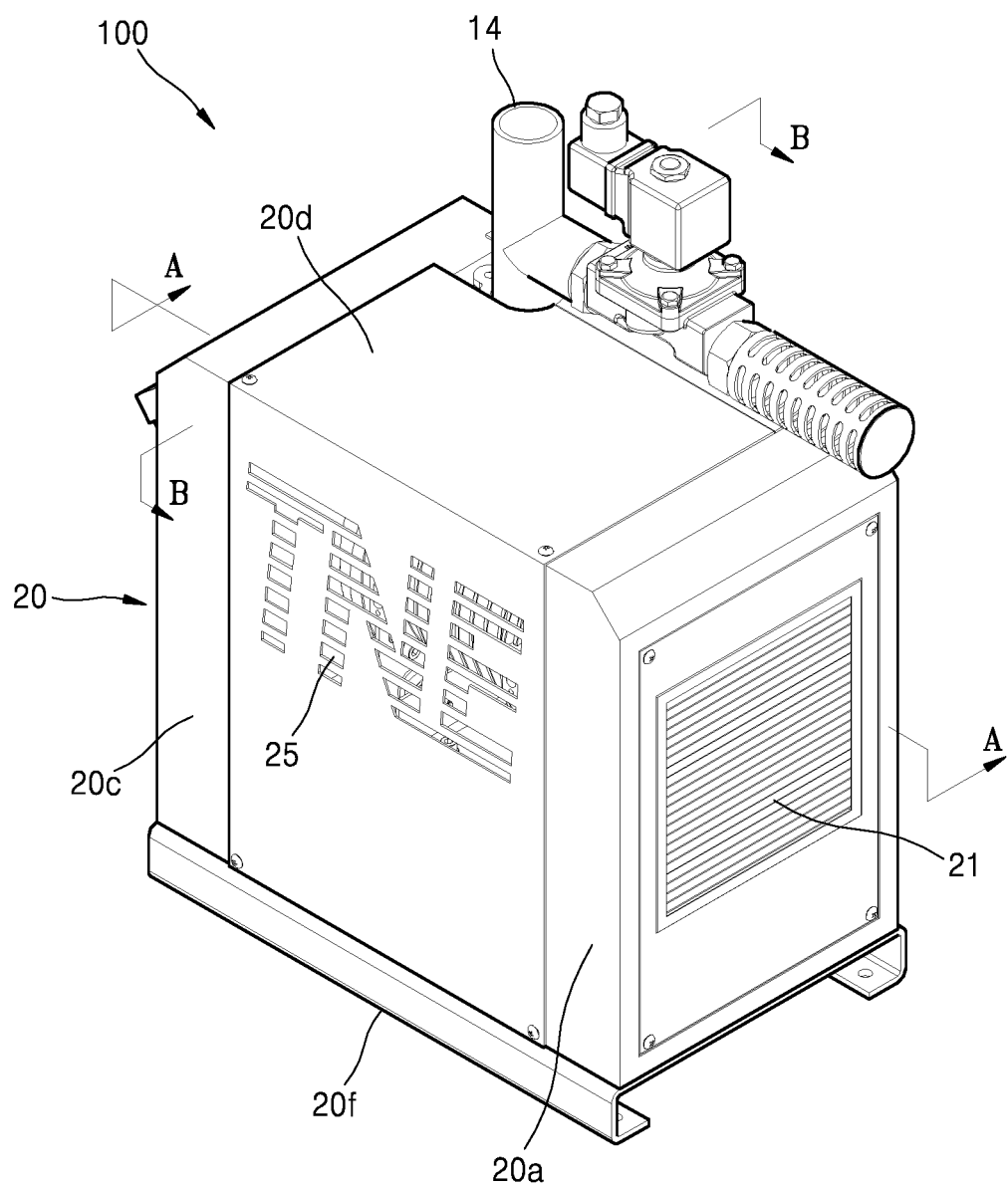
FIG. 1 is a perspective view of a blowing system according to an embodiment.
Figure 2:
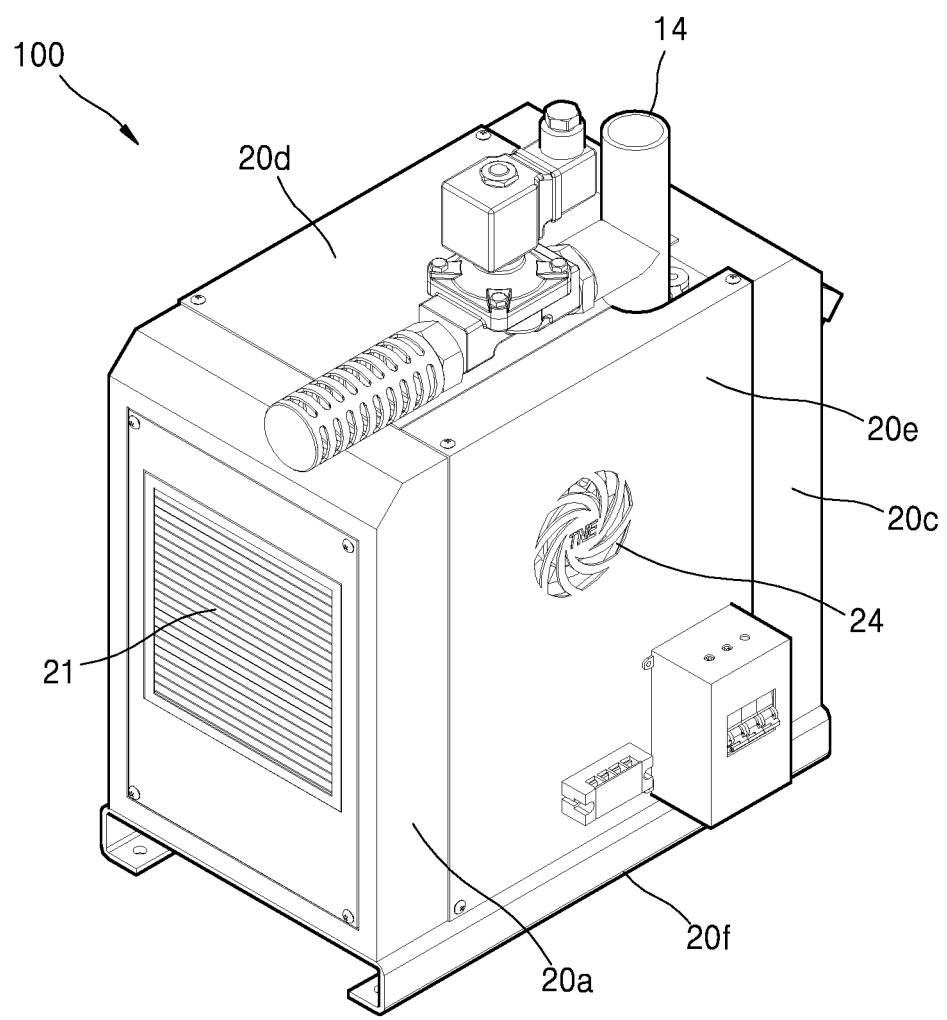
FIG. 2 is a perspective view of the blowing system illustrated in FIG. 1, which is seen from another angle.
Figure 3:
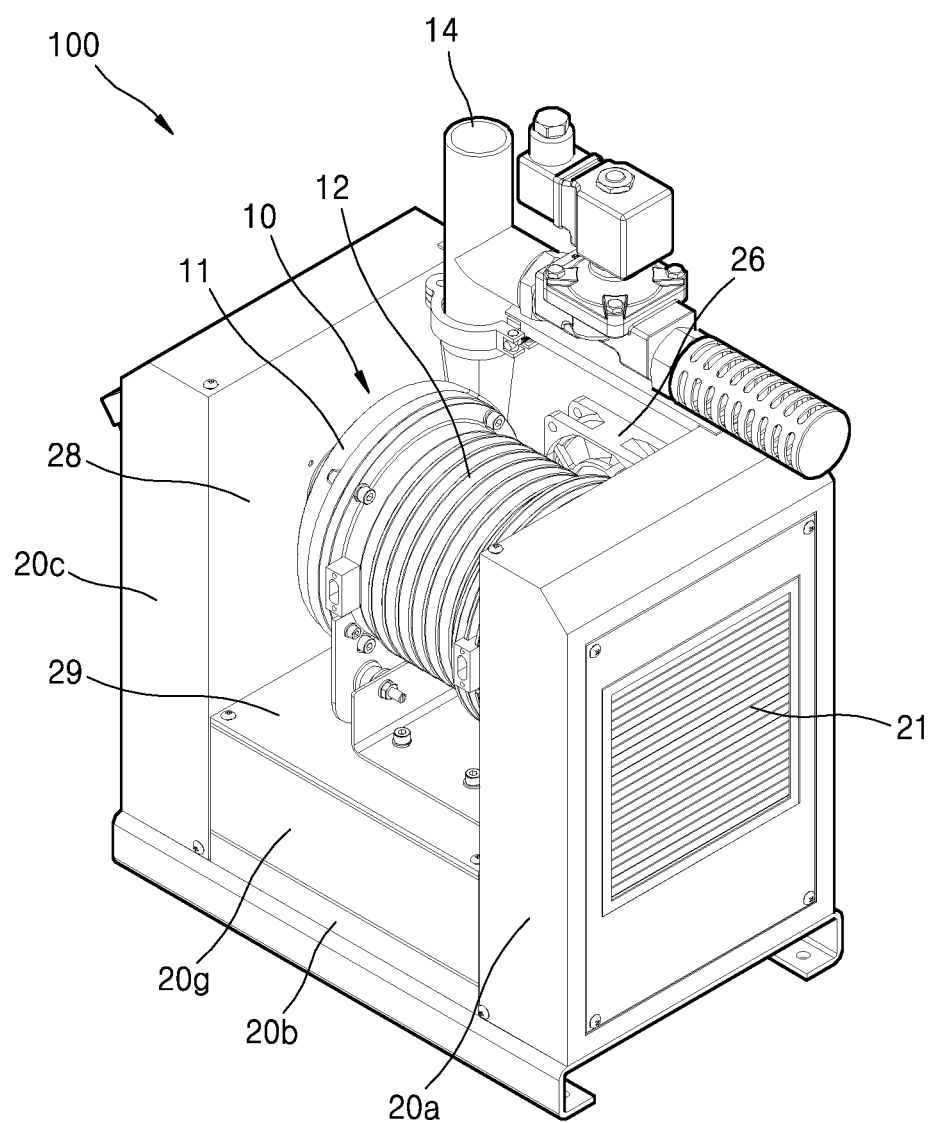
FIG. 3 is a perspective view of a blower of the blowing system illustrated in FIG. 1.

FIG. 1 is a perspective view of a blowing system 100 according to an embodiment. FIG. 2 is a perspective view of the blowing system 100 illustrated in FIG. 1, which is seen from another angle. FIG. 3 is a perspective view of a blower 10 of the blowing system 100 illustrated in FIG. 1.

Referring to FIGS. 1 through 3, the blowing system 100 according to a preferred embodiment is an electrical blowing system configured to suction a gas such as air, etc., and compress the gas to supply the gas to the outside, and is mainly used for powder transportation or aeration in a sewage disposal plant. The blowing system 100 includes a blower 10, a case 20, an inverter H, a cooling member 30, and a flow adjusting unit 40. Hereinafter, it is assumed that the gas is air.

The blower 10 is a type of a turbo blower or a turbo compressor, and is a centrifugal pump for rotating an impeller 11 at a high speed by using a rotational force of a motor 12 to suction air from the outside, compress the air, and ventilate the air to the outside.

The blower 10 includes the impeller 11, the motor 12, a blower inlet 13, and a blower outlet 14.

The impeller 11 is a main component of the centrifugal pump and is a wheel including a plurality of curved wings. The impeller 11 is mounted in a metal housing to be able to rotate at a high speed, and compresses the gas suctioned through the blower inlet 13.

The motor 12 is an electrical motor for generating a rotational force, and is mounted in the blower 10 to supply a high speed rotational force to the impeller 11.

Figure 4:
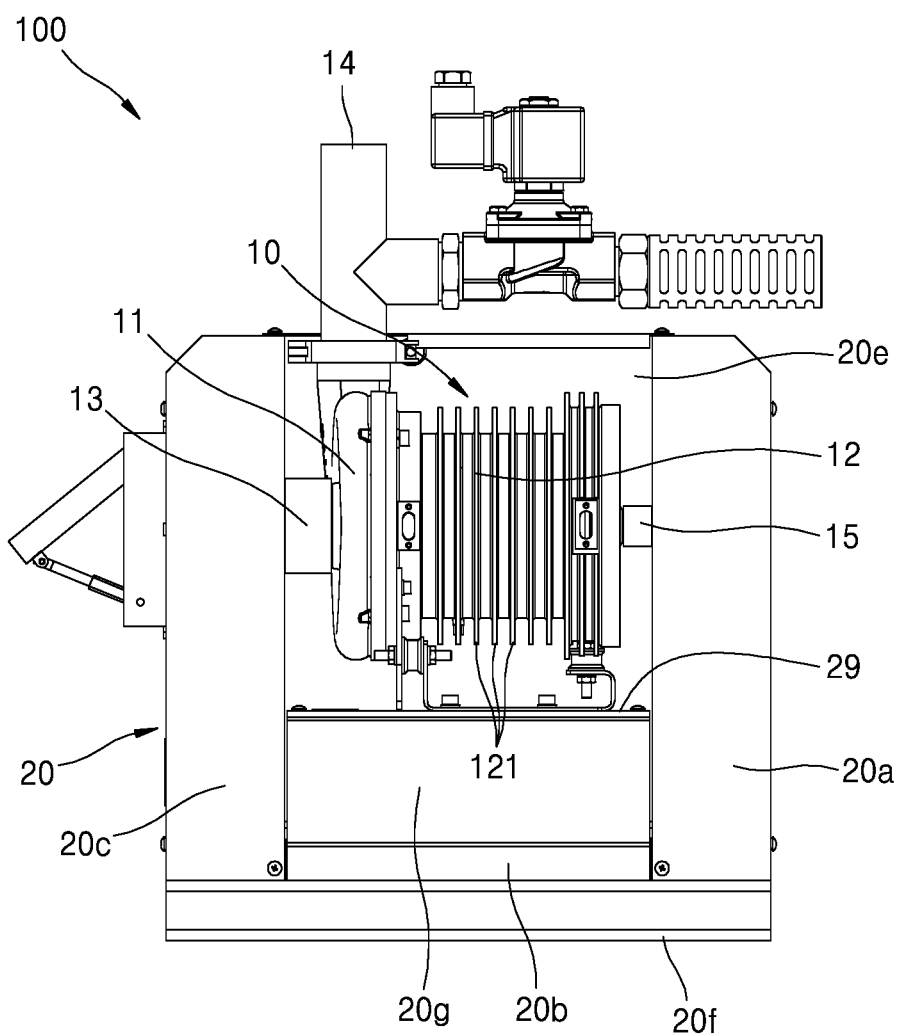
FIG. 4 is a front view of the blowing system illustrated in FIG. 3.

A plurality of motor cooling pins 121 for a cooling operation are arranged, in a protruded form, on an outer circumferential surface of the motor 12, as illustrated in FIG. 4.

In order to reduce a frictional force generated by a high speed rotation of the impeller 11 and the motor 12, various types of bearings (not shown) are mounted in the blower 10.

The motor 12 and the bearings form a main heat source of the blower 10.

The blower inlet 13 is a passage for suctioning the gas, which is to be ventilated, and the blower inlet 13 is connected to a front end of the impeller 11 so that the gas is transported to the impeller 11.

The blower outlet 14 is a passage for discharging the gas compressed by the impeller 11 at a high pressure to the outside, and is connected to an upper end of the impeller 11.

Figure 5:
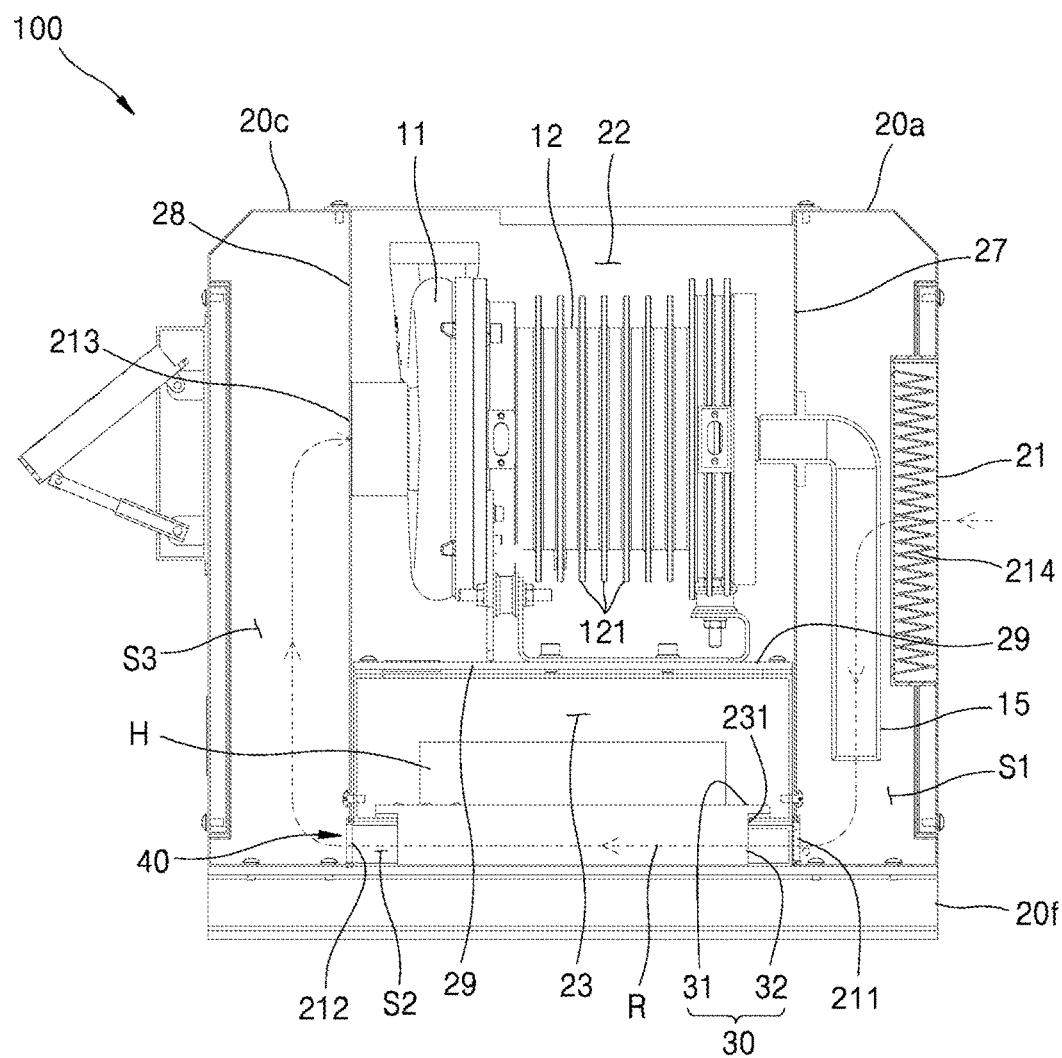
FIG. 5 is a cross-sectional view taken along a line A-A of the blowing system illustrated in FIG. 1.

A motor-cooling air inlet 15 for suctioning the gas for cooling the motor 12 is formed at a rear end of the motor 12, as illustrated in FIG. 5.

An end of the motor-cooling air inlet 15 is coupled to the rear end of the motor 12, and the other end of the motor-cooling air inlet 15 is arranged in a first space portion S1 to be described below.

The gas suctioned through the other end of the motor-cooling air inlet 15 passes through the motor 12 and is discharged through a blower receiving portion 22 to be described below.

The case 20 is a metal box for accommodating the blower 10 and is manufactured by processing a thin metal plate member. The case 20 includes a first body portion 20a, a second body portion 20b, a third body portion 20c, a covering member 20d, a rear wall portion 20e, and a supporting member 20f.

The first body portion 20a is a box member having a square section extending long in up and down directions, and is arranged perpendicularly standing at an upper right surface of the supporting member 20f, as illustrated in FIG. 1. Here, the supporting member 20f is a steel frame arranged in a mounting place of the blowing system 100.

A first perpendicular bulkhead 27 extends long in up and down directions at a left surface of the first body portion 20a.

A gas inlet 21 for suctioning the gas from the outside to the inside is formed at a right surface of the first body portion 20a.

A filter 214 for removing impurities from the suctioned gas is mounted in the gas inlet 21, as illustrated in FIG. 5.

The first space portion S1, which is an inner space connected to the gas inlet 21, is provided in the first body portion 20a.

A first via-hole 211 connected to the first space portion S1 is formed at a bottom portion of the first perpendicular bulkhead 27, as illustrated in FIG. 5.

The second body portion 20b is a pipe-type member having a square section extending long in right and left directions, and is arranged horizontally laid at an upper middle surface of the supporting member 20f, as illustrated in FIG. 3.

A second space portion S2, which is an inner space through which the gas may flow, is formed long in right and left directions in the second body portion 20b.

A right end of the second space portion S2 is connected to the first via-hole 211 of the first body portion 20a, as illustrated in FIG. 5.

The third body portion 20c is a box member having a square section extending long in up and down directions, and is arranged perpendicularly standing at an upper left surface of the supporting member 20f, as illustrated in FIG. 1.

A second perpendicular bulkhead 28 extends long in up and down directions on a right surface of the third body portion 20c.

A third space portion S3, which is an inner space through which the gas may flow, is provided long in the third body portion 20c, in up and down directions.

A third via-hole 213 connected to the blower inlet 13 is formed at an upper end of the second perpendicular bulkhead 28.

A second via-hole 212 connected to a left end of the second space portion S2 is formed at a lower end of the second perpendicular bulkhead 28, as illustrated in FIG. 5.

A floor member 29, which is a horizontally arranged flat plate member, is arranged between the first perpendicular bulkhead 27 and the second perpendicular bulkhead 28.

As illustrated in FIG. 5, a left end of the floor member 29 is coupled to the lower end of the second perpendicular bulkhead 28, and a right end of the floor member 29 is coupled to a lower end of the first perpendicular bulkhead 27.

The covering member 20d is a plate-type member, which is bent in a form of a "¬," and is a member for covering the blower receiving portion 22 so that the blower 10 is not exposed to the outside.

A cooling air outlet 25 through which the blower receiving portion 22 is connected to the outside is formed at a front surface of the covering member 20d.

A left end of the covering member 20d is detachably coupled to an upper end of the third body portion 20c, a right end of the covering member 20d is detachably coupled to an upper end of the first body portion 20a, and a lower end of the covering member 20d is detachably coupled to lower ends of the third body portion 20c and the first body portion 20a.

The rear wall portion 20e is a flat plate member perpendicularly arranged at a rear portion of the covering member 20d, as illustrated in FIG. 2.

A cooling air inlet 24 through which the blower receiving portion 22 is connected to the outside is formed in a middle portion of the rear wall portion 20e.

The cooling air inlet 24 is formed in a position linearly corresponding to the cooling air outlet 25.

A cooling fan 26 for suctioning air from the outside to the blower receiving portion 22 is mounted at an inner surface of the cooling air inlet 24.

According to the present embodiment, a small fan including a DC motor having relatively less power consumption is used as the cooling fan 26.

A left end of the rear wall portion 20e is detachably coupled to the third body portion 20c and a right end of the rear wall portion 20e is detachably coupled to the first body portion 20a.

The blower receiving portion 22 is a space for accommodating the heat source of the blower 10, such as the motor 12 and the bearings. According to the present embodiment, the blower receiving portion 22 receives the whole blower 10 including the impeller 11.

The blower receiving portion 22 is formed by a cooperation of the first perpendicular bulkhead 27, the second perpendicular bulkhead 28, the floor member 29, the covering member 20d, and the rear wall portion 20e.

Thus, the blower receiving portion 22 is arranged between an upper end of the first space portion S1 and an upper end of the third space portion S3.

An inverter receiving box 20g is horizontally arranged at a bottom surface of the floor member 29.

The inverter receiving box 20g is a rectangular box member, and an inverter receiving portion 23, in which electronic components including the inverter H are installed, is provided in the inverter receiving box 20g.

The inverter receiving portion 23 is arranged below the blower receiving portion 22, and the second space portion S2 is arranged below the inverter receiving portion 23, as illustrated in FIG. 5.

A fourth via-hole 231, which is square-shaped and connected to the second space portion S2, is formed on a bottom surface of the inverter receiving portion 23.

Thus, a gas passage R connected from the gas inlet 21 to the blower inlet 13 is formed by the first space portion S1, the second space portion S2, and the third space portion S3.

According to the present embodiment, the gas passage R is bent in a form of a "U" from the gas inlet 21 to the blower inlet 13, as illustrated in FIG. 5.

According to the present embodiment, the gas passage R is arranged at an outermost edge of an inner space of the case 20 so that heat of the gas flowing through the gas passage R is conducted to the case 20 to be discharged to the outside, as illustrated in FIG. 5.

In addition, the blower receiving portion 22 is spatially separated from the gas passage R, and thus, a sealing structure may be formed, whereby air heated by the heat source of the blower 10 does not flow into the gas passage R.

The inverter H is a device for generating a high speed current waveform for controlling a speed of the motor 12 and supplying the high speed current waveform to the motor 12, and includes a radiating component, such as an insulated gate bipolar transistor (IGBT).

The IGBT is an electrical device for generating the high speed current waveform, and generates a large amount of heat due to electrical switching, wherein the amount of heat increases in proportion to a switching frequency. The IGBT has a limit of temperatures at which the IGBT may be used, and thus, for a continual operation of the motor 12, the IGBT has to be continually cooled.

The cooling member 30 is a metal member for cooling the inverter H with air, and includes a base portion 31 and a cooling pin 32.

The base portion 31 is a metal flat plate member and has an upper surface coupled to a lower surface of the inverter H.

The cooling pin 32 is a square plate-type member protruding downwards from the base portion 31, extends long in right and left directions as illustrated in FIG. 5, and includes a plurality of cooing pins 32 arranged apart from each other by a predetermined distance.

An upper end of the cooling pin 32 is coupled to a lower surface of the base portion 31, and a lower end of the cooling pin 32 is exposed to a lower side via the fourth via-hole 231 of the inverter receiving box 20g so as to contact a floor of the second space portion S2.

According to the present embodiment, the lower end of the cooling member 30 contacts the upper surface of the supporting member 20f, and thus, heat is directly conducted from the cooling member 30 to the supporting member 20f to be discharged to the outside.

The gas may flow via spaces between the adjacent cooling pins 32 from among the plurality of cooling pins 32, and the gas passage R of the second space portion S2, formed by the adjacent cooling pins 32, becomes a base passage R1.

Figure 8:
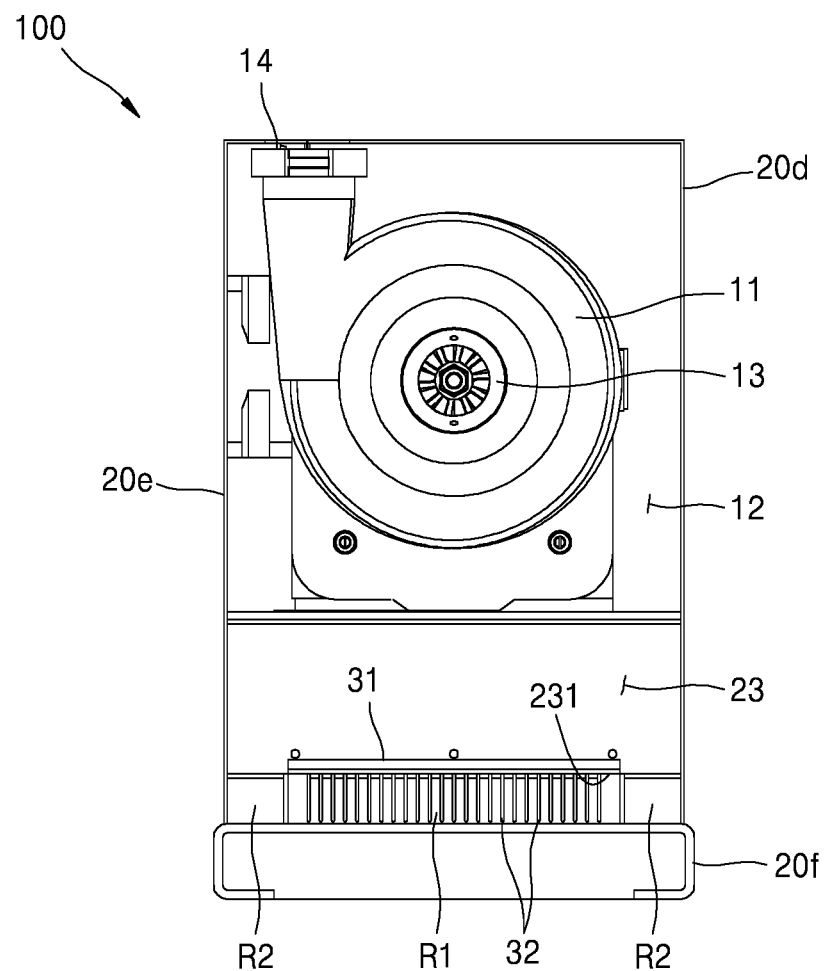
FIG. 8 is a front view of the blowing system illustrated in FIG. 7

The base passage R1 is located in a middle portion of the second space portion S2, as illustrated in FIG. 8, and is always open so that the gas may flow regardless of pressure loss between an upstream and a downstream of the cooling member 30.

An additional passage R2 is formed at each of left and right sides of the base passage R1 of the second space portion S2, and the base passage R1 and the additional passage R2 are spatially separated from each other so that gases in the base passage R1 and the additional passage R2 are not mixed.

The additional passage R2 is a passage for permitting a flow of the gas only when the pressure loss between the upstream and the downstream of the cooling member 30 is equal to or greater than a predetermined value.

That is, the gas passage R of the second space portion S2 includes the base passage R1 in the middle portion of the second space portion S2 and the pair of additional passages R2 arranged at the left and right sides of the base passage R1, respectively, as illustrated in FIG. 8.

The flow adjusting unit 40 is a device for automatically opening the additional passage R2 only when the pressure loss between the upstream and the downstream of the cooling member 30 is equal to or greater than a predetermined value, and includes a flow adjusting plate 41, an elastic member 42, and a weight member 43.

Figure 6:
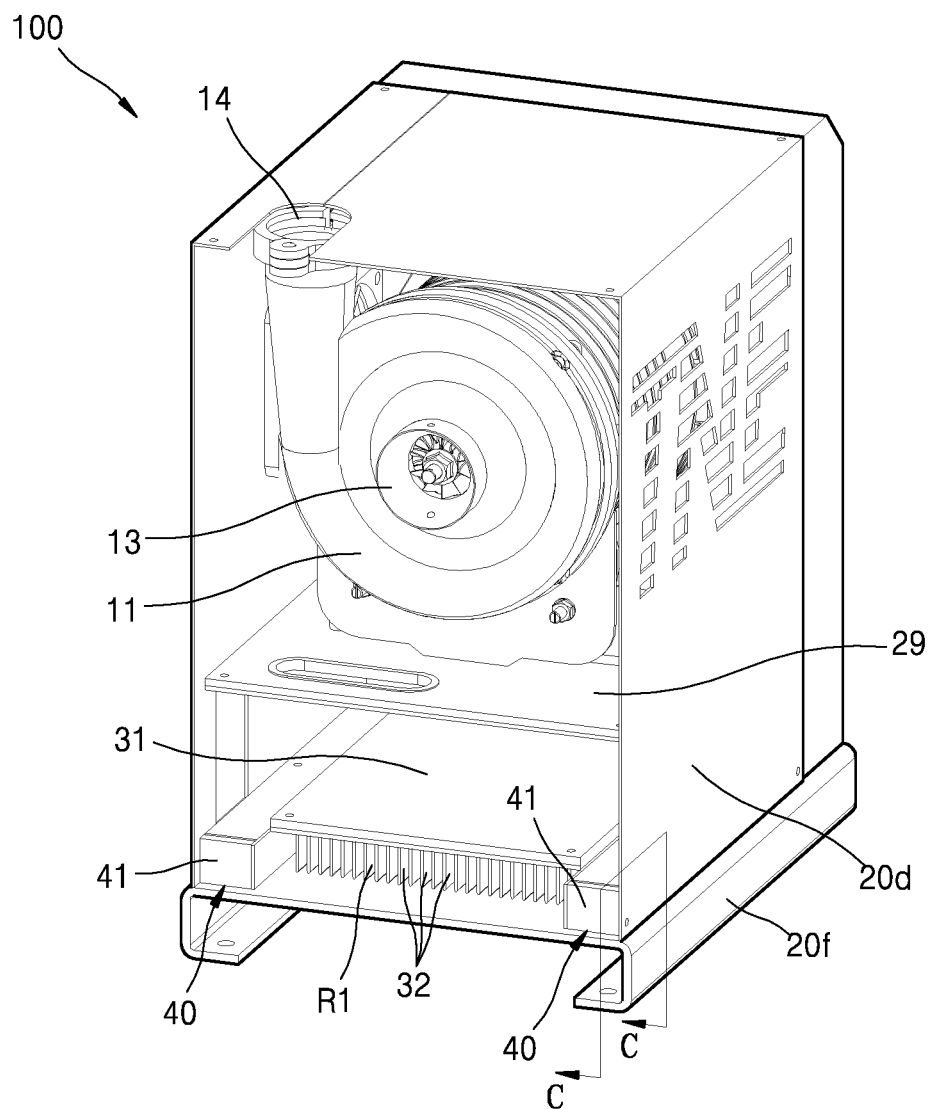
FIG. 6 is a cross-sectional view taken along a line B-B of the blowing system illustrated in FIG. 1.
Figure 7:
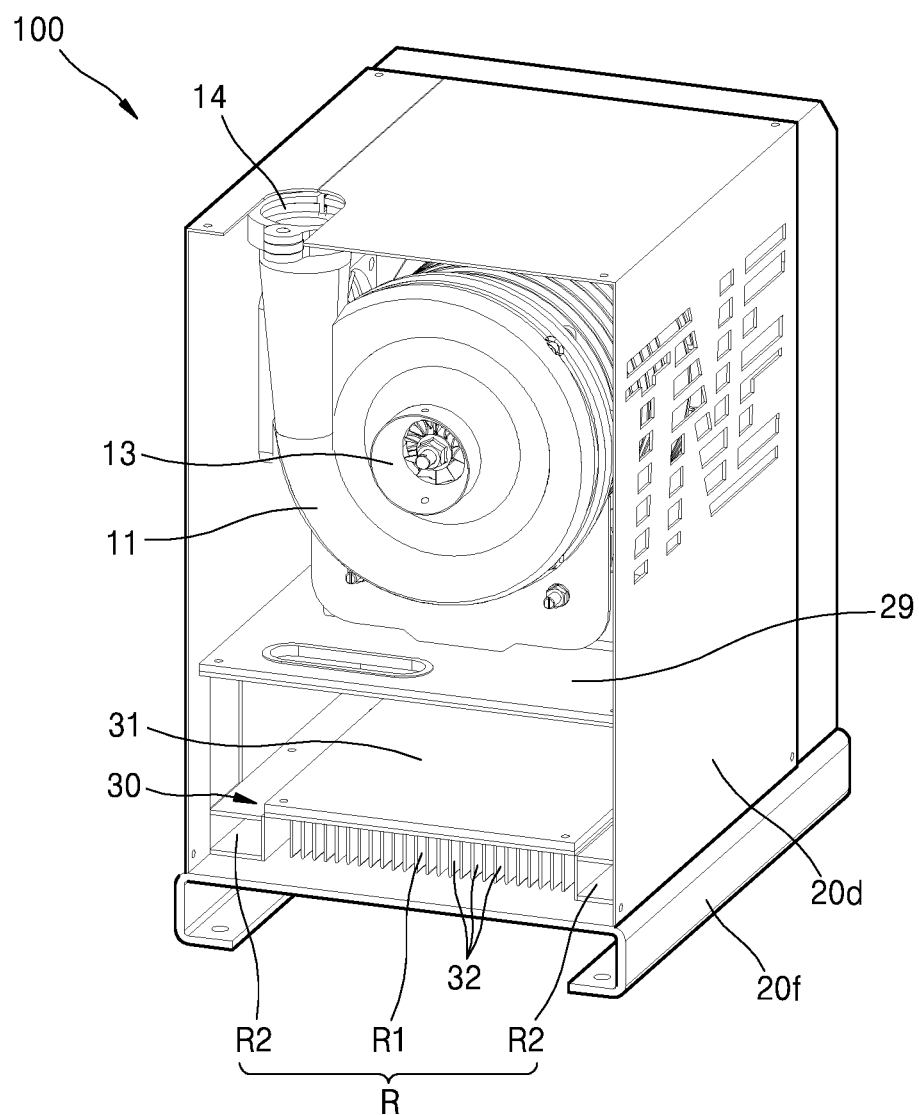
FIG. 7 is a partial cross-sectional view of the blowing system illustrated in FIG. 6.

The flow adjusting unit 40 is mounted at the additional passage R2 located at the downstream of the cooling member 30, as illustrated in FIGS. 5 and 6.

Figure 9:
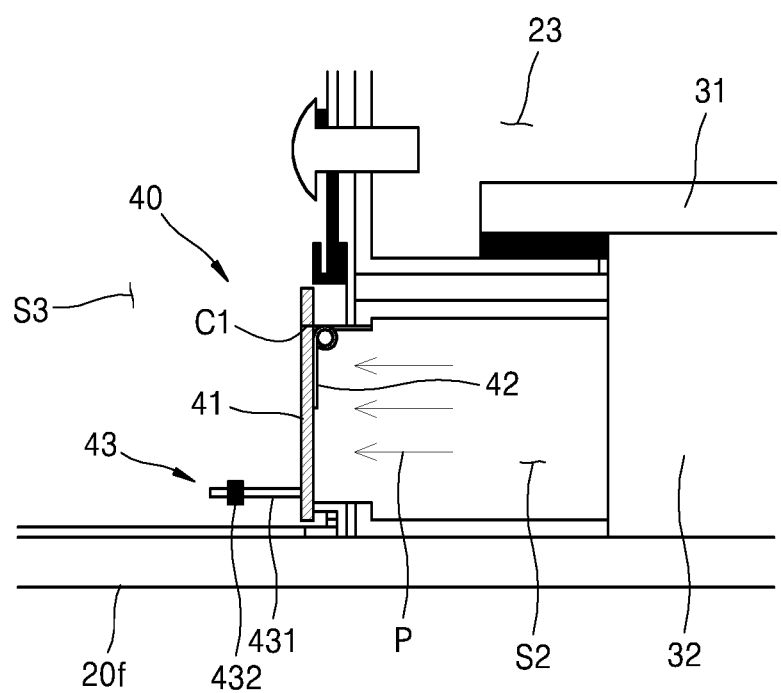
FIG. 9 is a cross-sectional view taken along a line C-C of a flow adjusting unit illustrated in FIG. 6.

The flow adjusting plate 41 is a square flat plate member as illustrated in FIG. 9 and is coupled to an upper end of the second via-hole 212 such that an upper end of the flow adjusting plate 41 is capable of a rotational motion.

The flow adjusting plate 41 is capable of the rotational motion between an opening position at which the additional passage R2 is opened and a closing position at which the additional passage R2 is closed, based on a rotational center C1 in the upper end of the second via-hole 212.

The elastic member 42 is a biasing device for elastically biasing the flow adjusting plate 41 to the closing position.

According to the present embodiment, a torsion spring mounted in the rotational center C1 is used as the elastic member 42.

The weight member 43 is a biasing device for biasing the flow adjusting plate 41 to the closing position via gravity and includes a bar portion 431 and a weight pendulum 432.

The bar portion 431 is a bar protruding long from the flow adjusting plate 41 to the left side, as illustrated in FIG. 9.

The weight pendulum 432 is a metal pendulum having a predetermined mass and is coupled to a distal end of the bar portion 431.

Figure 10:
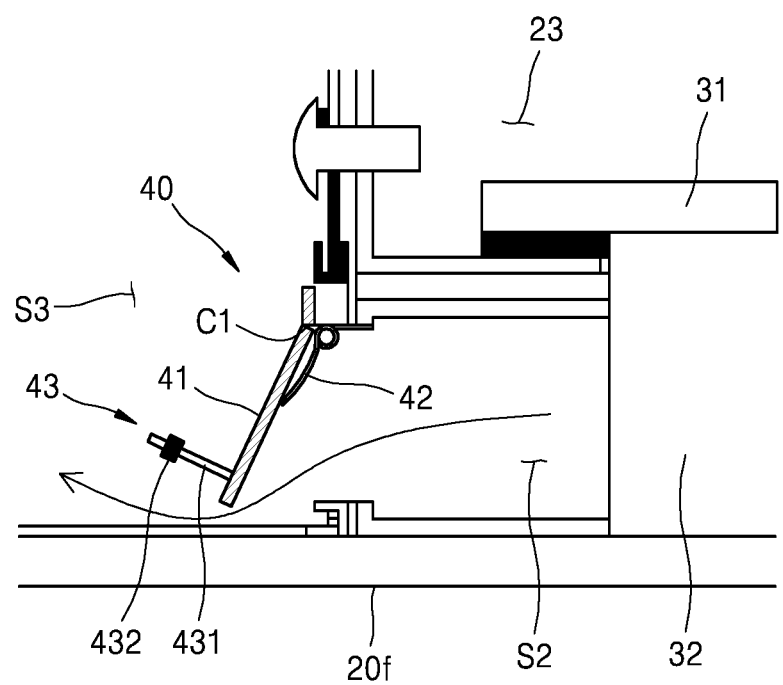
FIG. 10 is a view showing an open state of a flow adjusting plate of the flow adjusting unit illustrated in FIG. 9.

Thus, when the pressure loss between the upstream and the downstream of the cooling member 30 increases to a value that is equal to or greater than a predetermined value so that the gas pressure P illustrated in FIG. 9 increases to a value that is equal to or greater than a predetermined value, the flow adjusting plate 41 rotates to the opening position via the gas pressure P, to open the additional passage R2, as illustrated in FIG. 10.

Here, the gas pressure P has the value to offset an elastic force or a gravitational force of the elastic member 42 and the weight member 43.

On the contrary, when the pressure loss between the upstream and the downstream of the cooling member 30 is less than the predetermined value so that the gas pressure P illustrated in FIG. 9 has a value that is less than the predetermined value, the flow adjusting plate 41 remains in the closing position.

Here, the gas pressure P has the value that is less than the value to offset the elastic force or the gravitational force of the elastic member 42 and the weight member 43.

Hereinafter, an example of an operational principle of the blowing system 100 will be described.

First, when the motor 12 operates, the impeller 11 rotates at a high speed, and when the impeller 11 rotates at the high speed, the gas flows through the gas passage R via a suctioning force generated by the impeller 11.

To see an overall flowing passage of the gas, the gas from the outside is suctioned into the first space portion S1 via the gas inlet 21, and the gas suctioned into the first space portion S1 descends and flows into a right end of the second space portion S1 via the first via-hole 211, as illustrated in FIG. 5.

The gas flowing into the second space portion S1 flows through the base passage R1 and cools the cooling pin 32 of the cooling member 30. Here, when pressure loss between the upstream and the downstream of the cooling member 30 is less than a predetermined value, the flow adjusting plate 41 remains in the closing position, and thus, the whole gas flowing into the second space portion S1 flows through only the base passage R1.

On the contrary, when the pressure loss between the upstream and the downstream of the cooling member 30 increases to a value that is equal to or greater than the predetermined value, the flow adjusting plate 41 rotates to open the additional passage R1 as illustrated in FIG. 10, and thus, most of the gas flowing into the second space portion S2 flows through the base passage R1, and a portion of the gas flows through the additional passage R2.

That is, when the gas is not sufficiently supplied to the blower 10 via only the base passage R1, the additional passage R2 is automatically opened to supply additional gas to the blower 10.

The gas flowing through the second space portion S2 flows into the third space portion S3 through the second via-hole 212, and the gas flowing into the third space portion S3 ascends to flow into the blower inlet 13 through the third via-hole 231.

The gas flowing into the blower inlet 13 is compressed via the impeller 11 and is discharged to the outside via the blower outlet 14.

Meanwhile, air flowing into the cooling air inlet 24 is discharged to the outside via the cooling air outlet 25, and in this process, the motor 12 and the bearings mainly included in the heat source of the blower 10 are cooled.

The blowing system 100 having the structure described above includes: the blower 10 including: the blower inlet 13 for suctioning the gas; the impeller 11 for compressing the gas suctioned through the blower inlet 13; and the blower outlet 14 for discharging the gas compressed by the impeller 11 to the outside; the case 20 including: the blower receiving portion 22 for receiving a heat source of the blower 10; the gas inlet 21 for suctioning the gas from the outside; the gas passage R connected from the gas inlet 21 to the blower inlet 13; and the inverter receiving portion 23 in which electronic components including the inverter H are installed; and the cooling member 30 that is a member for cooling the inverter H by using air, and has one end coupled to the inverter H and the other end exposed to the gas passage R, wherein the blower receiving portion 22 is spatially separated from the gas passage R so that the gas heated by the heat source of the blower 10 does not flow into the gas passage R from the blower receiving portion 22, and the gas flows through the gas passage R by means of a suctioning force generated by the impeller 11, and the cooling member 30 is cooled by the gas. Thus, without including the separate cooling fan for cooling the inverter H, the inverter H may be quickly cooled by using only the flow of gas generated by the suctioning force of the impeller 11. Also, since the cooling fan having a short life span and frequent failures is not used, the overall life span of the product may increase.

In the blowing system 100, the cooling member 30 includes: the base portion 31 coupled to the inverter H; and the plurality of cooling pins 32 protruding from the base portion 31 and arranged apart from each other by a predetermined distance. Thus, a surface area contacting the gas may increase to improve the cooling efficiency.

In the blowing system 100, the gas passage R includes: the first space portion S1 connected to the gas inlet 21; the second space portion S2 connected to the other end of the cooling member 30; and the third space portion S3 connected to the blower inlet 13. Thus, a length of the gas passage R may increase and it may be easy to make complex bending shapes of the gas passage R.

In the blowing system 100, the blower receiving portion 22 is arranged between the first space portion S1 and the third space portion S3, the inverter receiving portion 23 is arranged below the blower receiving portion 22, the second space portion S2 is arranged below the inverter receiving portion 23, and the gas passage R is bent in a form of a "U." Thus, the second space portion S2 in which the cooling member 30 is arranged may be arranged at a lowermost edge of the case 20 to increase the cooling efficiency. Also, noise of turbulent flow generated around the blower inlet 13 located at a distal end of the gas passage R may be rarely discharged to the outside via the gas passage R.

The blowing system 100 further includes: the cooling air inlet 24 formed at a surface of the blower receiving portion 22; the cooling air outlet 25 formed at the other surface of the blower receiving portion 22; and the cooling fan 26 mounted in at least one of the cooling air inlet 24 and the cooling air outlet 25 and suctioning the air from the outside into the blower receiving portion 22. Since the blower receiving portion 22 is spatially separated from the gas passage R, the air heated by the motor 12 and the bearing (not shown) mainly included in the heating radiating portion of the blower 10 may not penetrate through the gas passage R to degrade the performance of the blower 10, and the air heated by the motor 12 and the bearing may be quickly discharged to the outside.

In the blowing system 100, the second space portion S2 includes: the base passage R1 through which the gas flows regardless of pressure loss between an upstream and a downstream of the cooling member 30; and the additional passage R2 through which the gas flows only when the pressure loss between the upstream and the downstream of the cooling member 30 is equal to or greater than a predetermined value. Thus, when a flow amount of the gas suctioned through the impeller 11 increases, the additional passage R2 may be open to prevent an excessive increase in the pressure loss between the upstream and the downstream of the cooling member 30.

In the blowing system 100, the flow adjusting unit 40 is mounted in the additional passage R2 to automatically open the additional passage R2 when the pressure loss between the upstream and the downstream of the cooling member 30 is equal to or greater than the predetermined value and to automatically close the additional passage R2 when the pressure loss between the upstream and the downstream of the cooling member 30 is less than the predetermined value. Thus, the additional passage R2 may be automatically opened or closed without an additional manipulation of an operator.

In the blowing system 100, the flow adjusting unit 40 includes: the flow adjusting plate 41 capable of a rotational motion between an opening position at which the flow adjusting unit 40 opens the additional passage R2 and a closing position at which the flow adjusting unit 40 closes the additional passage R2; and the biasing devices 42 and 43 for biasing the flow adjusting plate 41 to the closing position elastically or gravitationally. Thus, when the pressure loss between the upstream and the downstream of the cooling member 30 is less than the predetermined value, the additional passage R2 may be stably fixed at the closing position.

In the blowing system 100, the other end of the cooling member 30 contacts the case 20, and thus, heat may be conducted from the cooling member 30 to the case 20 to be discharged to the outside.

In the blowing system 100, the gas passage R is arranged at an outer portion of an inner space of the case 20, and thus, heat of the gas flowing through the gas passage R may be conducted to the case to be quickly discharged to the outside.

According to the present embodiment, both the elastic member 42 and the weight member 43 are used as the biasing device. However, only one of the elastic member 42 and the weight member 43 may be used as the biasing device.

While the present inventive concept has been particularly shown and described with reference to exemplary embodiments thereof, it will be understood by one of ordinary skill in the art that various changes in form and details may be made therein without departing from the spirit and scope of the present inventive concept as defined by the following claims. Hence, it will be understood that the embodiments described above are not limiting of the scope of the invention. For example, each component described in a single type may be executed in a distributed manner, and components described distributed may also be executed in an integrated form.

The scope of the present inventive concept is indicated by the claims rather than by the detailed description of the invention, and it should be understood that the claims and all modifications or modified forms drawn from the concept of the claims are included in the scope of the present inventive concept.

The invention claimed is:

1. A blowing system for compressing and supplying a gas, to the outside, the blowing system comprising:
   a blower comprising:
   a blower inlet for suctioning the gas;
   an impeller for compressing the gas suctioned through the blower inlet; and
   a blower outlet for discharging the gas compressed by the impeller to the outside;
   a case comprising:
   a blower receiving portion for receiving a heat source of the blower;
   a gas inlet for suctioning the gas from the outside;
   a gas passage connected from the gas inlet to the blower inlet; and
   an inverter receiving portion in which electronic components comprising an inverter are installed; and
   a cooling member that is a member for cooling the inverter by using the gas, and has one end coupled to the inverter and the other end exposed to the gas passage,
   wherein the blower receiving portion is spatially separated from the gas passage so that a second gas heated by the heat source of the blower does not flow from the blower receiving portion into the gas passage, and
   the gas flows through the gas passage due to a suctioning force generated by the impeller, and the cooling member is cooled by the gas.

2. The blowing system of claim 1, wherein the cooling member comprises:
   a base portion coupled to the inverter; and
   a plurality of cooling pins protruding from the base portion and arranged apart from each other by a predetermined distance.

3. The blowing system of claim 1, wherein the gas passage comprises:
   a first space portion connected to the gas inlet;
   a second space portion connected to the other end of the cooling member; and
   a third space portion connected to the blower inlet.

4. The blowing system of claim 3, wherein the blower receiving portion is arranged between the first space portion and the third space portion,
   the inverter receiving portion is arranged below the blower receiving portion,
   the second space portion is arranged below the inverter receiving portion, and
   the gas passage is bent in a form of a "U."

5. The blowing system of claim 3, wherein the second space portion comprises:
   a base passage through which the gas flows regardless of pressure loss between an upstream and a downstream of the cooling member; and
   an additional passage through which the gas flows only when the pressure loss between the upstream and the downstream of the cooling member is equal to or greater than a predetermined value.

6. The blowing system of claim 5, wherein a flow adjusting unit is mounted in the additional passage to automatically open the additional passage when the pressure loss between the upstream and the downstream of the cooling member is equal to or greater than the predetermined value and to automatically close the additional passage when the pressure loss between the upstream and the downstream of the cooling member is less than the predetermined value.

7. The blowing system of claim 6, wherein the flow adjusting unit comprises:
   a flow adjusting plate capable of performing a rotational motion between an opening position at which the flow adjusting unit opens the additional passage and a closing position at which the flow adjusting unit closes the additional passage; and
   a biasing device for biasing the flow adjusting plate to the closing position elastically or gravitationally.

8. The blowing system of claim 1, further comprising:
   a cooling air inlet formed at a surface of the blower receiving portion;
   a cooling air outlet formed at the other surface of the blower receiving portion; and
   a cooling fan mounted in at least one of the cooling air inlet and the cooling air outlet and suctioning the second gas from the outside into the blower receiving portion.

9. The blowing system of claim 1, wherein the other end of the cooling member contacts the case so that heat is conducted from the cooling member to the case and discharged to the outside.

10. The blowing system of claim 1, wherein the gas passage is arranged at an outer portion of an inner space of the case so that heat of the gas flowing through the gas passage is conducted to the case and discharged to the outside.

* * * * *